United States Patent
Lutz et al.

(10) Patent No.: US 7,145,255 B2
(45) Date of Patent: Dec. 5, 2006

(54) LATERAL PROGRAMMABLE POLYSILICON STRUCTURE INCORPORATING POLYSILICON BLOCKING DIODE

(75) Inventors: Robert C. Lutz, Sunnyvale, CA (US); Thomas S. Wong, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 64 days.

(21) Appl. No.: 10/927,771

(22) Filed: Aug. 26, 2004

(65) Prior Publication Data

US 2006/0043526 A1  Mar. 2, 2006

(51) Int. Cl.
*H01L 27/112* (2006.01)
(52) U.S. Cl. .............. 257/910; 257/529; 257/538; 257/E27.051; 257/E29.327; 257/E29.335; 365/105
(58) Field of Classification Search .......... 257/481, 257/529, 538, 603, 910, E27.051, E29.327, 257/E29.335; 365/105
See application file for complete search history.

(56) References Cited

U.S. PATENT DOCUMENTS

| | | | |
|---|---|---|---|
| 3,810,127 A * | 5/1974 | Hoff, Jr. ................. 365/96 |
| 4,124,899 A | 11/1978 | Birkner et al. | |
| 4,420,820 A * | 12/1983 | Preedy ................... 365/105 |
| 4,494,135 A * | 1/1985 | Moussie ................. 257/50 |
| 4,538,167 A * | 8/1985 | Yoshino et al. ........... 257/50 |
| 5,270,587 A | 12/1993 | Zagar | |
| 6,897,543 B1 * | 5/2005 | Huang et al. ............. 257/530 |

\* cited by examiner

*Primary Examiner*—N. Drew Richards
*Assistant Examiner*—Matthew E. Warren
(74) *Attorney, Agent, or Firm*—Patent Law Group LLP; Carmen C. Cook

(57) ABSTRACT

A programmable element includes a diode and a programmable structure formed in a polysilicon layer isolated from a semiconductor substrate by a dielectric layer. The diode includes a first region and a second region of opposite conductivity types. The programmable structure includes a third region and a fourth region of opposite conductivity types. The first region of the diode and the third region of the programmable structure are electrically connected. In operation, the programmable structure is programmed to a low impedance state when a voltage exceeding a first breakdown voltage of the programmable structure is applied to reverse bias the programmable structure. The programmable element can be used to form a programmable array having very low parasitic capacitance, enabling the realization of a large and ultra fast programmable logic array.

10 Claims, 9 Drawing Sheets

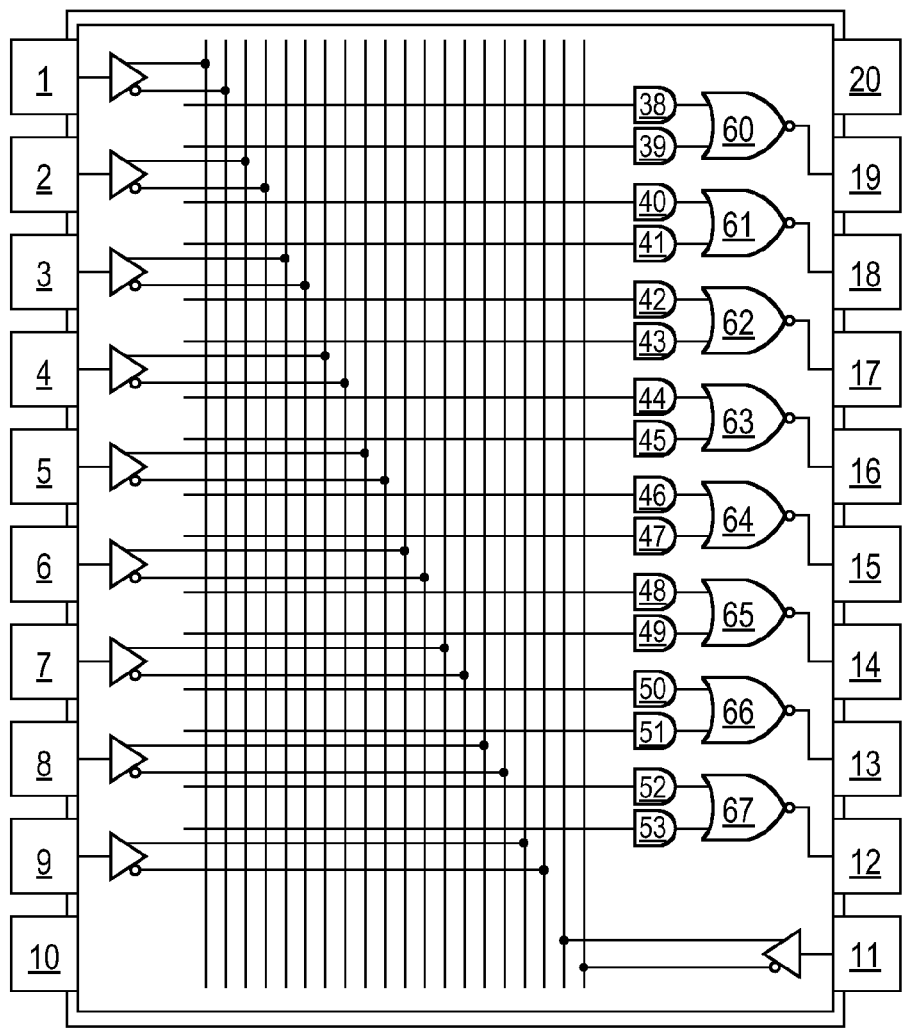
Figure 1
(Prior Art)
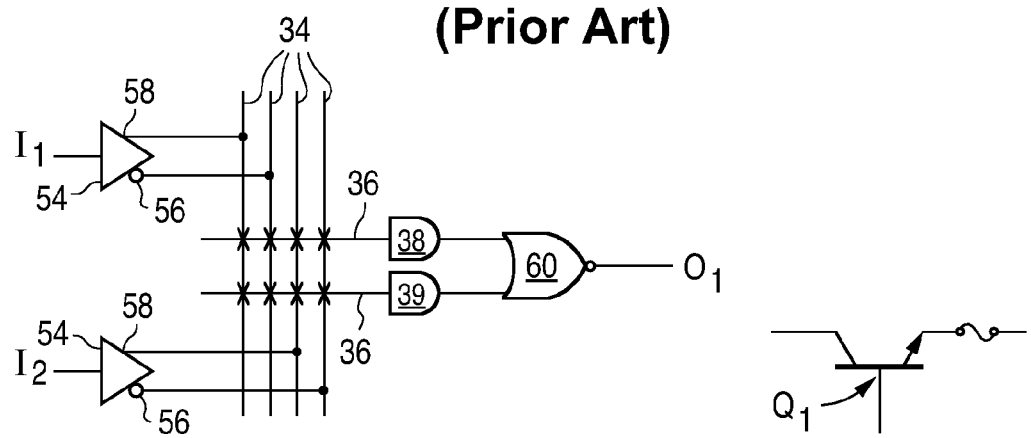
Figure 2A
(Prior Art)
Figure 2B
(Prior Art)

LATERAL PROGRAMMABLE POLYSILICON STRUCTURE INCORPORATING POLYSILICON BLOCKING DIODE

FIELD OF THE INVENTION

The invention relates to field programmable logic devices and, in particular, to a programmable polysilicon structure including a polysilicon blocking diode.

DESCRIPTION OF THE RELATED ART

Programmable integrated circuits, such as programmable read only memories (PROMs), programmable logic arrays (PLAs), and programmable logic devices (PLDs), are known. These programmable devices permit implementation of user-configurable logic functions. Typically, an array of logic AND gates and an array of logic OR gates are provided, either or both of which can be programmed by blowing or not blowing fusible links.

For example, a programmable array logic (PAL) device is disclosed in U.S. Pat. No. 4,124,899 which patent is incorporated herein by reference. FIG. 1 duplicates FIG. 6A of the '899 patent and illustrates a programmable array logic circuit including a programmable matrix or array connecting ten input signals (input pins 1–9 and 11) to an array of programmable AND gates denoted as "AND gates" 38–53. The AND gate outputs are connected non-programmably to a respective OR gate.

At each array site, that is, at the intersection of each vertical and horizontal line, a transistor and a serially connected programmable connection are provided to either connect or disconnect the associated input logic signal to the horizontal line. Thus, by programming the fusible connections, the vertical input lines can selectively propagate the input logic signals via the transistor and fusible link present at each array site, dependent on the state of the fuse.

FIG. 2A duplicates FIG. 4 of the '899 patent and illustrates a detailed schematic of a part of the PAL circuit. Each "x" symbol represents an intact fusible link that allows an input signal on a vertical line to propagate through a transistor to a horizontal conductor. FIG. 2B duplicates FIG. 3C of the '899 patent and illustrates schematically the fusible connection used in the programmable array. As discussed above, each array site includes a fusible link and a transistor Q1 connected in series with that fuse. Transistors that remain connected after programming form the desired AND gate function, with the logical result present on the associated horizontal array line. Thus, a multiple input AND function is realized within the array. In FIG. 1, each multiple input AND function is depicted as a "single input AND gate" 38–53 for simplicity. The AND symbol is placed at the end of each horizontal array line as a shorthand denoting the functionality of the logic array. Each AND symbol represents a multiple input gate that can be programmed to realize the AND function of any combination of the input logic signals.

Programmable integrated circuits implemented using fusible links are one-time programmable devices and are typically fabricated using bipolar technologies. Typically, the fuse is formed as a conductive metallic silicide, nichrome or tungsten-titanium alloy link in series with a bipolar junction transistor, as shown in FIG. 2B. As fabricated, the fuse is a short circuit, but may be programmed to an open circuit by forcing a high current through the link. This high current causes the fuse material to melt and separate.

In an alternate programmable technology, the programmable link is initially formed as a diode, such as the base-emitter junction of a bipolar transistor. Because the collector-base junction and the base-emitter junction of the bipolar transistor form back-to-back diodes, the path from collector to emitter is an open circuit as formed as no current flows through the back-to-back diodes. However, when excessive current or a sequence of current pulses is applied to the emitter terminal, the base-emitter junction diode is caused to breakdown and becomes shorted, thereby programming the link to a short. The collector-base diode remains intact and serves as a blocking diode, allowing the formation of programmable arrays. In still another programmable device technology, anti-fuses are used in place of fusible links. Anti-fuses are also open circuit as formed and "shorted" anti-fuse connections are created by the application of high voltage or current.

A disadvantage of the conventional programmable integrated circuits is that the programmable matrix introduces a large amount of parasitic capacitance. Accordingly, the speed of the programmable ICs is limited. Similarly, it is difficult to use conventional technologies to build ultra-high speed programmable arrays of useful size. Therefore, it is desirable to provide a programmable device that can be built into a large array while providing high speed performance.

SUMMARY OF THE INVENTION

According to one embodiment of the present invention, a programmable element includes a diode and a programmable structure formed in a polysilicon layer. The polysilicon layer is formed on the top of a dielectric layer and is electrically isolated from an underlying semiconductor substrate by the dielectric layer. The diode includes a first region of a first conductivity type and a second region of a second conductivity type. The programmable structure includes a third region of the first conductivity type and a fourth region of the second conductivity type. The first region of the diode and the third region of the programmable structure are electrically connected. In operation, the programmable structure is programmed to a low impedance state when a voltage exceeding a first breakdown voltage of the programmable structure is applied to reverse bias the programmable structure.

The programmable element of the present invention can be used to form a programmable array. According to another aspect of the present invention, a programmable array includes a multiple number of row lines coupled to a first set of nodes, a multiple number of column lines coupled to a second set of nodes, and a multiple number of programmable elements. Each programmable element is coupled to a respective one of the row lines and a respective one of the column lines.

According to yet another aspect of the present invention, a programmable element includes a first p-n junction, a second p-n junction and a transistor. The first p-n junction is formed in a first portion of a polysilicon layer where the polysilicon layer is formed on the top surface of a dielectric layer. The dielectric layer is formed on the top surface of a semiconductor substrate and electrically isolating the polysilicon layer from the underlying semiconductor substrate. The first p-n junction includes a first region of a first conductivity type and a second region of a second conductivity type. The second p-n junction is formed in a second portion of the polysilicon layer. The second p-n junction includes a third region of the first conductivity type and a fourth region of the second conductivity type where the first region of the first p-n junction and the third region of the second p-n junction is electrically connected. The breakdown voltage of the first p-n junction is about the same as the breakdown voltage of the second p-n junction. Finally, the transistor has a control terminal coupled to receive a programming voltage exceeding the breakdown voltage of the first or second p-n junction, a first current handling terminal coupled to the second region, and a second current handling terminal coupled to a first voltage source. In operation, one of the first and second p-n junctions is programmed to a low impedance state when a programming voltage exceeding the breakdown voltage of the first or second p-n junction is applied to the control terminal of the transistor.

The present invention is better understood upon consideration of the detailed description below and the accompanying drawings.

BRIEF DESCRIPTION OF THE DRAWINGS

FIG. 1 duplicates FIG. 6A of the '899 patent and illustrates a programmable array logic circuit including a programmable matrix or array connecting ten input signals to an array of AND gates.

FIG. 2A duplicates FIG. 4 of the '899 patent and illustrates a detailed schematic of a part of the PAL circuit.

FIG. 2B duplicates FIG. 3C of the '899 patent and illustrates schematically the fusible connection used in the programmable array.

DETAILED DESCRIPTION OF THE PREFERRED EMBODIMENTS

Figure 3:
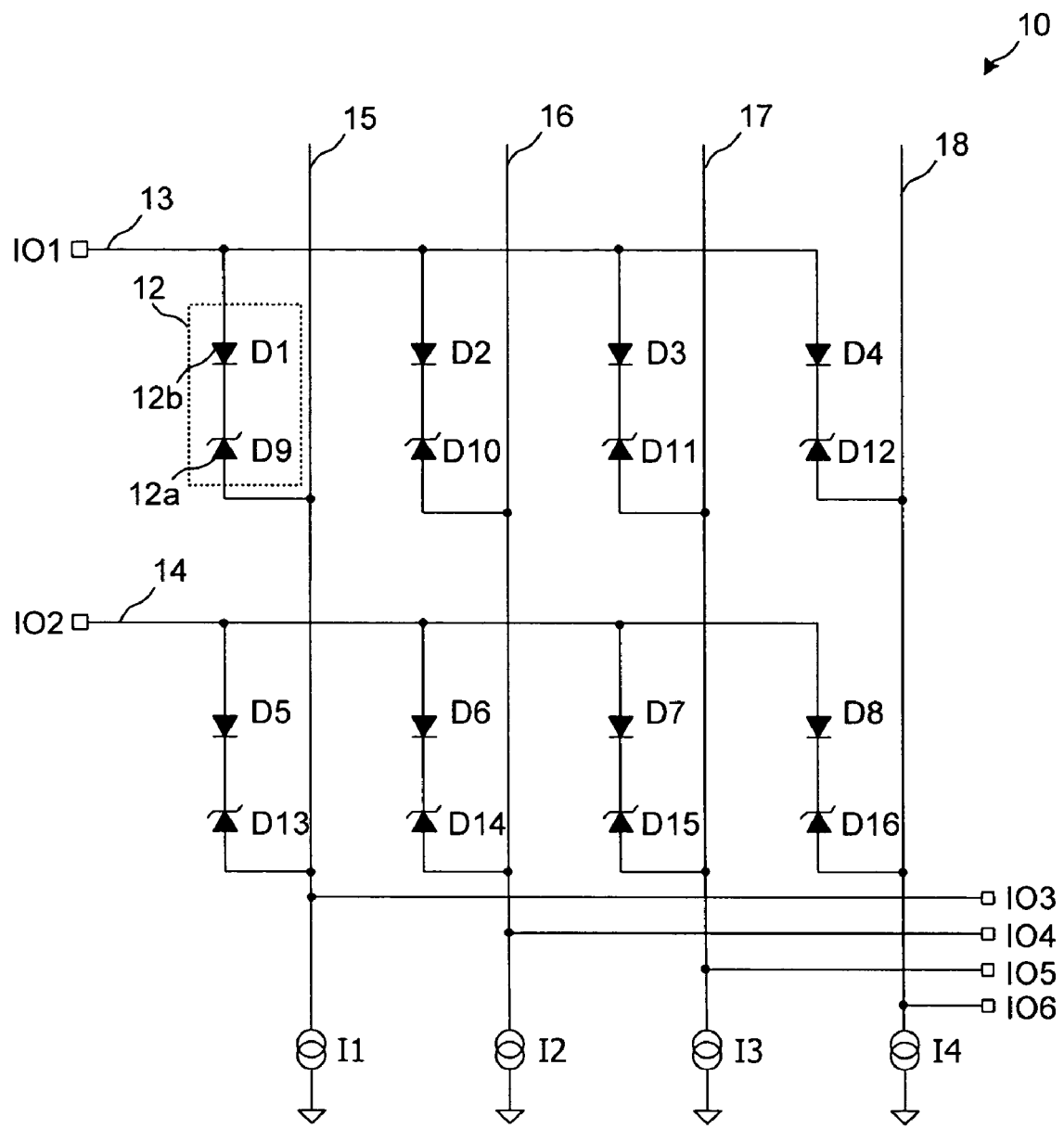
FIG. 3 is a schematic diagram of an array of programmable elements according to one embodiment of the present invention.

In accordance with the principles of the present invention, a programmable element includes a programmable polysilicon structure in series with a polysilicon blocking diode. In one embodiment, the programmable polysilicon structure is a polysilicon zener zap device. The programmable element of the present invention can be formed into an array or a matrix to realize a programmable device, such as a programmable array logic circuit. The blocking diode incorporated in each programmable polysilicon structure operates to prevent unintended programming of other programmable elements within the same array. After programming, those diodes connected to programmed (shorted) devices become inputs to the programmable gate thus formed. Because the programmable element is formed entirely in polysilicon isolated from the substrate, an array of programmable elements can have a very low parasitic capacitance. Thus, the programmable element of the present invention can be used to form large programmable array that can be operated at high speed, as well as smaller arrays that can operate at ultra-high speed.

In another embodiment, the programmable element includes a bipolar transistor coupled in series with the programmable polysilicon structure and the polysilicon blocking diode to enable high speed operation of the programmable structure. Because the base-emitter junction of the bipolar transistor typically has a low reverse-bias breakdown voltage, it is often difficult to incorporate a bipolar transistor in a programmable array as the base-emitter junction of one bipolar transistor is susceptible to breakdown when another programmable element is being programmed. However, in accordance with the present invention, a polysilicon blocking diode is added to boost the over all breakdown voltage of each programmable element, thereby enabling the use of ultra-fast bipolar transistors which exhibit low breakdown voltages to program the programmable polysilicon structures and further improve operating performance. The programmable element of the present invention including a bipolar transistor is array-compatible and can be used to form a programmable device including an array or a matrix of programmable elements. Furthermore, as will be apparent from the description below, when the programmable element of the present invention includes a bipolar transistor, the programmable polysilicon structure and the polysilicon blocking diode can have identical breakdown characteristics so that the functions of the two devices become interchangeable. That is, when the programmable element includes a bipolar transistor, the programmable element can be characterized as including two identically constructed p-n junctions where either p-n junction can function as the blocking diode or the programmable polysilicon structure, depending on the arrangement and connection of the diffusion regions in the p-n junctions.

The programmable element of the present invention can be readily integrated into a range of integrated circuit fabrication processes, including bipolar, BiCMOS and CMOS processes. In most cases, the programmable element can be incorporated in an existing fabrication process with little or no additional fabrication complexity.

The advantages of the programmable element of the present invention are numerous. First, because the blocking diode and the programmable structure are formed using the same polysilicon material and formed under substantially similar processing conditions, the blocking diode and the programmable structure have compatible electrical characteristics. Therefore, it is possible to design a programmable array of programmable elements having the desired programming characteristics and the desired breakdown characteristics.

Second, as discussed above, the programmable element of the present invention is formed entirely in polysilicon and isolated from the underlying substrate. Therefore, the programmable element presents very low parasitic capacitance. The programmable element of the present invention can be formed into a large programmable array while still maintaining a very low level of parasitic capacitance. Thus, a large programmable array of programmable elements of the present invention can be built while achieving very high speed of operation, such as in the Giga-hertz range. In conventional programmable devices, the programmable structure and/or the blocking diode are formed in the underlying silicon substrate. When the blocking diodes are formed in the silicon substrate, the blocking diodes present a large parasitic capacitance due to interaction from the substrate. Therefore, the speed of conventional programmable devices is limited, especially for large arrays. In accordance with the present invention, because the programmable elements are isolated from the silicon substrate by a dielectric layer, such as a field oxide layer, parasitic effects caused by interaction with the substrate is substantially reduced. Thus, a large array of programmable elements of the present invention can achieve ultra-fast logic speeds at moderate power levels. The performance improvements that can be realized from using the programmable element of the present invention can enable the development of ultra-fast emitter-coupled logic (ECL) and current mode logic (CML) programmable integrated circuits.

FIG. 3 is a schematic diagram of an array of programmable elements according to one embodiment of the present invention. Referring to FIG. 3, an array 10 includes two rows by four columns of programmable elements 12, each row and column line being coupled to a respective input/output node. Input signals IO1 and IO2 are coupled to row lines 13 and 14 of array 10. Signals IO1 and IO2 can be any input signals to the array such as the complementary signals of a single input signal. Each row line in array 10 is coupled to column lines 15 to 18 through a respective programmable element 12. Column lines 15–18 are coupled to respective output ports IO3 to IO6. Array 10 is an elementary programmable logic array where signals IO1 and IO2 are logic inputs and signal IO3–IO6 are logic outputs. Programmable array 10 realizes a negative AND function, that is, an output signal (e.g., IO3) is at a logic "low" only when all "attached" input signals (those having a shorted fusible connection at the corresponding programmable element) are also at a logical "low".

Each programmable element 12 includes a programmable polysilicon structure (or programmable structure) 12a and a polysilicon blocking diode 12b in a serial back-to-back connection. Programmable elements 12 are normally open-circuit and the programmable structure 12a becomes short-circuited when programmed. Therefore, row lines 13 and 14 are normally unconnected to column lines 15–18. A programmable structure 12a is programmed to a short circuit so as to permit a high row line signal to unilaterally couple through the respective diode 12b, causing a respective high column line signal.

Figure 5:
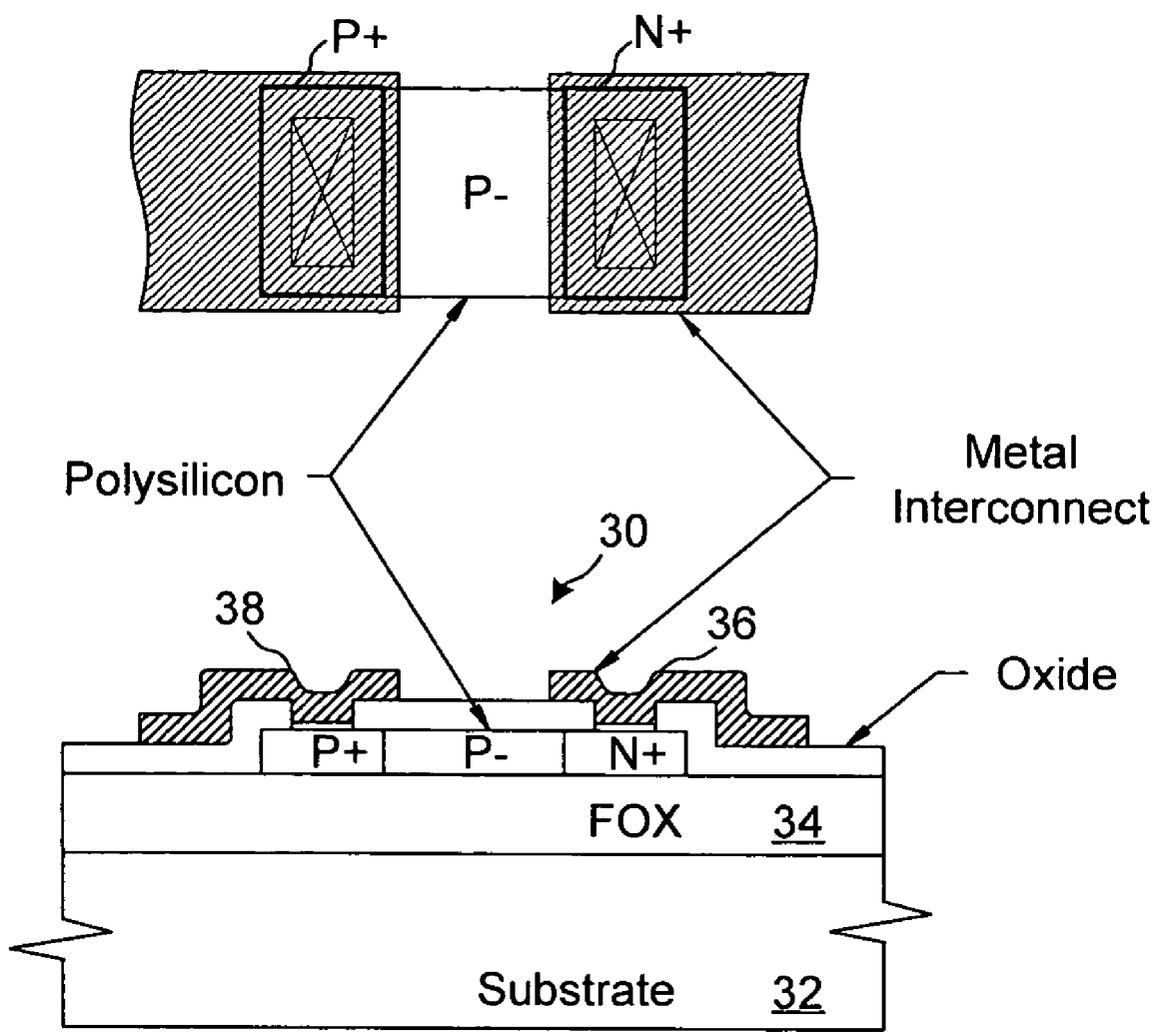
FIG. 5 illustrates a top view and the corresponding cross-sectional view of a zener zap device described in U.S. Pat. No. 6,621,138.

In FIG. 3, the n-terminals of the polysilicon structure 12a and the polysilicon blocking diode 12b are connected together. In the present embodiment, programmable polysilicon structure 12a is a polysilicon zener zap device. The polysilicon zener zap device 12a can be selectively "programmed" to a low impedance (or shorted) state by "zapping" which is the application of a high reverse breakdown current to the zener zap device. A zener zap device formed in polysilicon is described in commonly assigned U.S. patent application Ser. No. 10/277,638, entitled "Zener-Like Trim Device in Polysilicon," by Martin Alter, filed Oct. 21, 2002, now U.S. Pat. No. 6,621,138, issued on Sep. 16, 2003, which application is incorporated herein by reference in its entirety. FIG. 5 illustrates a top view and the corresponding cross-sectional view of a zener zap device described in the aforementioned '138 patent.

Referring to FIG. 5, a zener-like p-n junction diode 30 (referred herein as a zener-like diode or a zener zap device 30) includes an N+ and a P+ region formed in a polysilicon layer overlying a dielectric layer, such as a field oxide layer 34. The central part of the polysilicon layer is lightly doped with p-type dopants. Thus, the zener-like p-n junction diode is electrically and thermally isolated from silicon substrate 32. Zener zap device 30 can therefore be zapped at relatively low zap currents, such as less than 50 mA, for forming a reliable conductive connection between the metallization contacts 36 and 38 to the p-type and n-type regions of the diode. Zener zap device 30 of FIG. 5 can be zapped in both the reverse bias mode and the forward bias mode. In programmable array 10 of FIG. 3, the polysilicon zener zap device 12a is programmed in the reverse bias mode only.

Figure 6A:
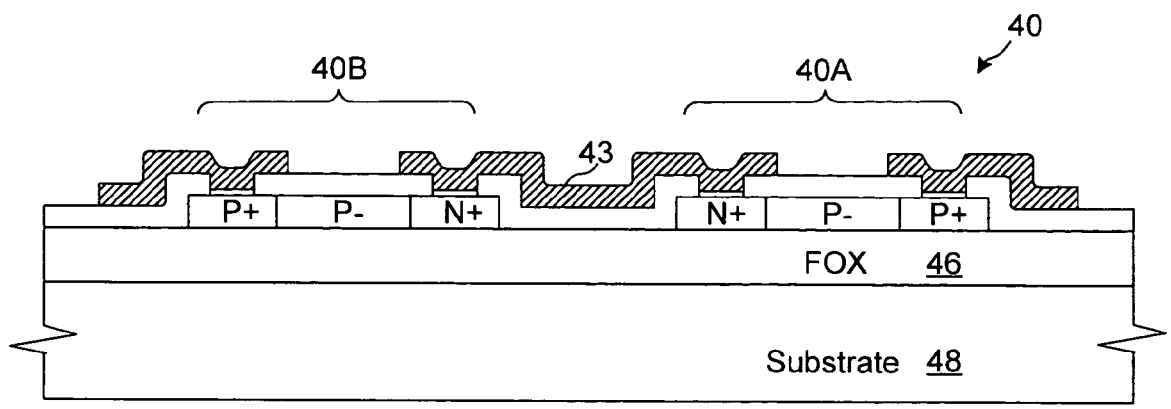
FIGS. 6A to 6C illustrate implementations of the programmable element of FIG. 3 according to three different embodiments of the present invention.
Figure 6B:
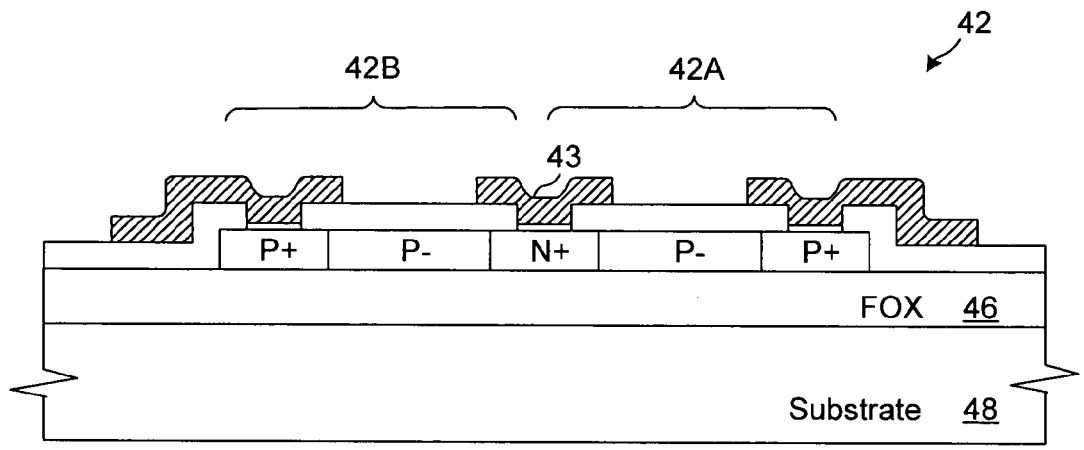
Figure 6C:
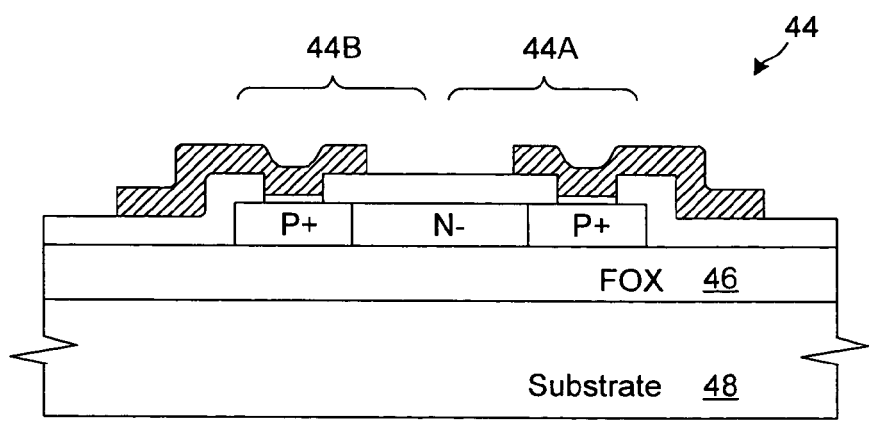

FIGS. 6A to 6C illustrate alternative implementations of programmable element 12 according to three different embodiments of the present invention. In all the structures, the programmable element is formed on top of a field oxide layer 46 overlying a silicon substrate 48, thereby isolating the programmable element from the silicon substrate and maintaining a low parasitic capacitance for each programmable element. In other embodiments, a dielectric layer other than a field oxide layer can be used to insulate the programmable element from the silicon substrate. Furthermore, in FIGS. 5 and 6A to 6C, the metal contacts to the polysilicon layer include an intervening barrier metal layer. The barrier metal layer is optional.

Referring to FIG. 6A, programmable element 40 includes a blocking diode 40B formed as a lateral diode in a polysilicon layer and a programmable structure 40A formed as a lateral polysilicon zener zap device also in the polysilicon layer. In the present embodiment, blocking diode 40B is formed in a polysilicon layer that is lightly doped with p-type dopants. Thus, the polysilicon layer has a P-type concentration. The blocking diode 40B includes a heavily doped N+ region and a heavily doped P+ region. In the present embodiment, the heavily doped N+ region and the heavily doped P+ region are spaced apart and the base polysilicon layer completes the p-n junction. The p-n junction is thus formed at the junction of the N+ region to the P– polysilicon.

Similar to the construction of blocking diode 40B, zener zap device 40A is formed in a polysilicon layer that is lightly doped with p-type dopants. Zener zap device 40A includes a heavily doped N+ region and a heavily doped P+ region. In the present embodiment, the heavily doped N+ region and the heavily doped P+ region are also spaced apart and the base polysilicon layer completes the p-n junction. As can be seen in FIG. 6A, blocking diode 40B and zener zap device 40A have similar diode structure and thus have similar electrical characteristics.

In the embodiment shown in FIG. 6A, blocking diode 40B and zener zap device 40A are formed as separate lateral polysilicon diode structures using separate polysilicon portions. A metal line 43 connects the N+ terminal of blocking diode 40B to the N+ terminal of zener zap device 40A. FIG. 6B illustrates a programmable element 42 whereby a blocking diode 42B and a zener zap device 42A are formed as a contiguous polysilicon structure in a single polysilicon portion. Specifically, the two back-to-back diodes are formed by merging the N+ regions of the two lateral diodes into a single N+ region. A metal contact 43 is coupled to the N+ region to provide a source of metal for forming a metal filament across the p-n junction when the zener zap device 42A is zapped. By forming programmable element 42 in a single polysilicon structure, the packing density of an array of programmable elements can increase with further reduction in parasitic capacitance.

FIG. 6C illustrates yet another embodiment of a programmable element 44 whereby the center N+ region is eliminated and a blocking diode 44B and a zener zap device 44A are formed with a merged N− region. Programmable element 44 is programmed by zapping one of the two identically formed p-n junctions locally, instead of zapping from a metallization contact to a metallization contact as in the structures in FIGS. 6A and 6B. Thus, programmable element 44 is formed without a metallization contact to the merged N− region and thus programmable element 44 can have a very small dimension.

Returning to FIG. 3, array 10 includes eight programmable elements. The blocking diodes of each programmable element are denoted D1-8 while the zener zap devices are denoted D9 to D16. The programming of single elements within array 10 can be accomplished as follows. To program a specific site, such as zener zap device D9, a programming voltage Vp which is a positive voltage exceeding the breakdown voltage of the zener zap device (referred herein as voltage Vz) plus the forward voltage drop of blocking diode D1 (referred herein as voltage VFB) is applied to the associated row line, that is, row line 13. All other row lines (such as row line 14) in the array are driven to a low voltage or are kept open. A low voltage, such as 0 volts, is maintained on the associated column line, that is, column line 15. Alternately, the voltage on the column line can be a voltage that is more negative than the programming voltage by roughly the magnitude of the programming voltage. By the application of a positive voltage on row line 13 and a low voltage on column line 15, blocking diode D1 is forward biased while zener zap device D9 is reversed biased.

When sufficient current flows in the reversed biased zener zap device D9 to cause localized heating of the p-n junction of the zener zap diode, the zener zap device is zapped whereby any barrier metal at the bottom of the metallized contact is destroyed, enabling rapid aluminum alloying to occur to short the junction. While the same programming current flows through blocking diode D1, less heat is generated at the blocking diode as the forward bias voltage, VFB, is much less than the reverse breakdown voltage Vz. Therefore, blocking diode D1 remains intact during programming.

Assuming all other row and column lines are open, the programming current is directed through diode D1 and zener zap device D9 causing the zener zap device to be zapped to a low impedance state. However, to assure that the selected programmable element and no other is programmed, the blocking diodes of all other programming elements of array 10 have to withstand the programming voltage without breaking down. This is because when one programmable element is being programmed, the blocking diode of another programmable element can become reverse biased. If the blocking diode is subjected to a reverse bias voltage that is greater than the breakdown voltage of the diode, the blocking diode can breakdown, robbing current from the element to be programmed and possibly leading to inadvertent programming of other elements.

To illustrate, assume that zener zap device D10 is already programmed to a short circuit and zener zap device D9 is being programmed. A positive programming voltage Vp is applied to row line 13, and diodes D1 and D2 are both forwarded biased. As a result of blocking diode D2 being forward biased and zener zap device D10 being shorted, column line 16 is also driven to the high programming voltage Vp minus the forward bias voltage of diode D2. Thus, column line 16 is driven to approximately the breakdown voltage Vz of the zener zap device. Under this voltage biasing condition, other blocking diodes coupled to column line 16 become reverse biased. For instance, blocking diode D6 has its p-terminal coupled to row line 14 which is at a low voltage, such as 0 volt. The n-terminal of blocking diode D6 is biased up to the positive voltage Vz on column line 16 through forward biased zener zap device D14. Thus, blocking diode D6 is reverse biased, and the breakdown voltage of diode D6 needs to marginally exceed the breakdown voltage Vz to prevent diode D6 from breaking down. If diode D6 enters breakdown, a large current may flow through diode D6 in the reverse direction, which is not desired. Since the structure of blocking diode D6 is similar to that of a programmable "zener zap" diode (e.g., D9–D16), application of a large reverse current may cause the diode to become irreversibly shorted, destroying its ability to function as a blocking diode. Furthermore, diode D6 diverts current from the intended programming site (D9) and may result in the intended site not being programmed. Therefore, in the embodiment shown in FIG. 3, the blocking diode in each programmable element should have a reverse bias breakdown voltage that exceeds the breakdown voltage Vz of the zener zap device to prevent inadvertent programming.

In practice, the degree by which the blocking diode breakdown voltages must exceed the zener zap breakdown is determined by factors such as programming current induced voltage drops in the row and column metal lines and the polysilicon structures themselves. By design, such effects are made small compared to the intended programming voltage. As shown in FIG. 6, structures of the blocking diode and zener zap programmable element are identical and should inherently exhibit nearly identical characteristics, including reverse breakdown voltages, regardless of the specific process parameters employed.

Figure 10:
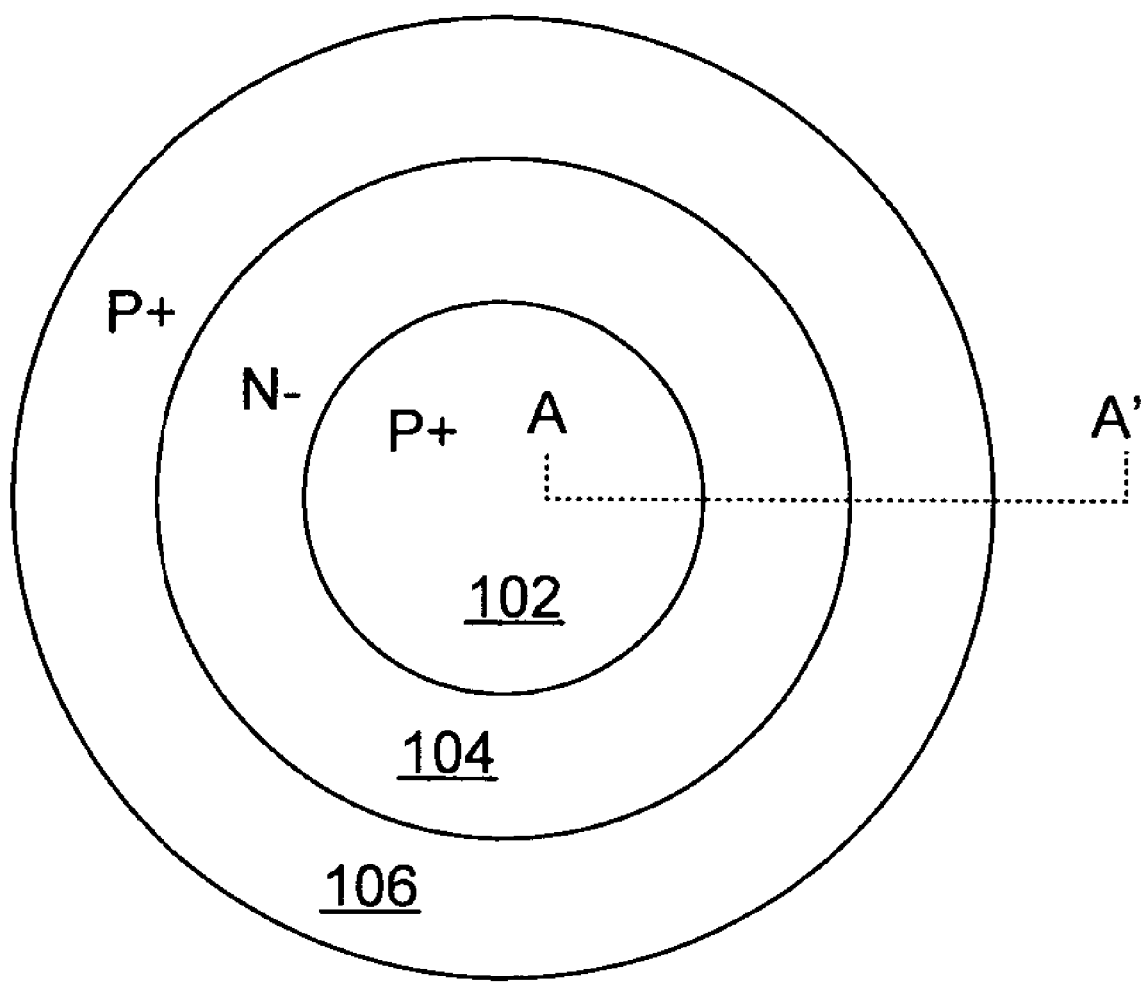
FIG. 10 is a top view of one embodiment of a programmable element of the present invention formed as a merged blocking diode and zener zap device structure as shown in FIG. 6C.

Any of several techniques, familiar to those who are skilled in the art, may be used to induce the desired, relative difference in breakdown voltages. For example, doping of the central, lightly doped portion of the zener zap device can be selectively increased to lower its breakdown. Similarly, the spacing between the N+ and P+ portions of the zener zap device can be made significantly less than the spacing employed in the blocking diodes, again lowering the zener zap breakdown voltage relative to the blocking diode breakdown. Finally, specific layout geometry can be used to promote programming of the zener zap device before the blocking diode even when the two devices have similar breakdown characteristic. FIG. 10 is a top view of one embodiment of a programmable element of the present invention formed as a merged blocking diode and zener zap device structure as shown in FIG. 6C. In FIG. 10, the P+/N−/P+ diffusion regions of the programmable element are formed as concentric circles. The cross-section through a line A–A' is the structure shown in FIG. 6C. The inner p-n junction formed by P+ region 102 and N− region 104 will program more easily than the outer p-n junction formed by P+ region 106 and N− region 104 because the smaller perimeter of the inner junction increases the power density and local heating relative to the outer junction Thus, the layout shown in FIG. 10 can be used to form a programmable element of the present invention where the inner p-n junction best serves as the zener zap device and the outer p-n junction best serves as the blocking diode.

After array 10 is programmed, the programming elements can be "read" by applying a relatively positive voltage to one or more row lines 13–14 and sinking a small current from the column lines 15–18. Current sources 11 to 14 coupled to column lines 15–18 denote the current being drawn from each column line. When one or more of the zener zap device is "zapped" and the associated row (or input) line is high, the associated column line will exhibit a high voltage level. As discussed above, array 10 realizes a logic function. Subsequent to programming, the blocking diodes in programmable elements 12 implement a multi-input, negative logic AND function where results are provided on the respective output ports.

The embodiments of programmable elements discussed above are illustrative only. Several other variations including changing the connection sequence of the diode and the zener zap device, elimination of the metal and barrier contact from one end of the diode structure, as well as changing other geometric properties of these structures. The salient feature of the programmable elements of the present invention is that the arrays of programmable zener zap device and blocking diode elements are constructed within a single polysilicon layer. Since a polysilicon layer is an inherent feature within most integrated circuit fabrication processes, the programmable element of the present invention provides a method of adding high performance programmability to many semiconductor manufacturing processes at low cost.

Figure 4:
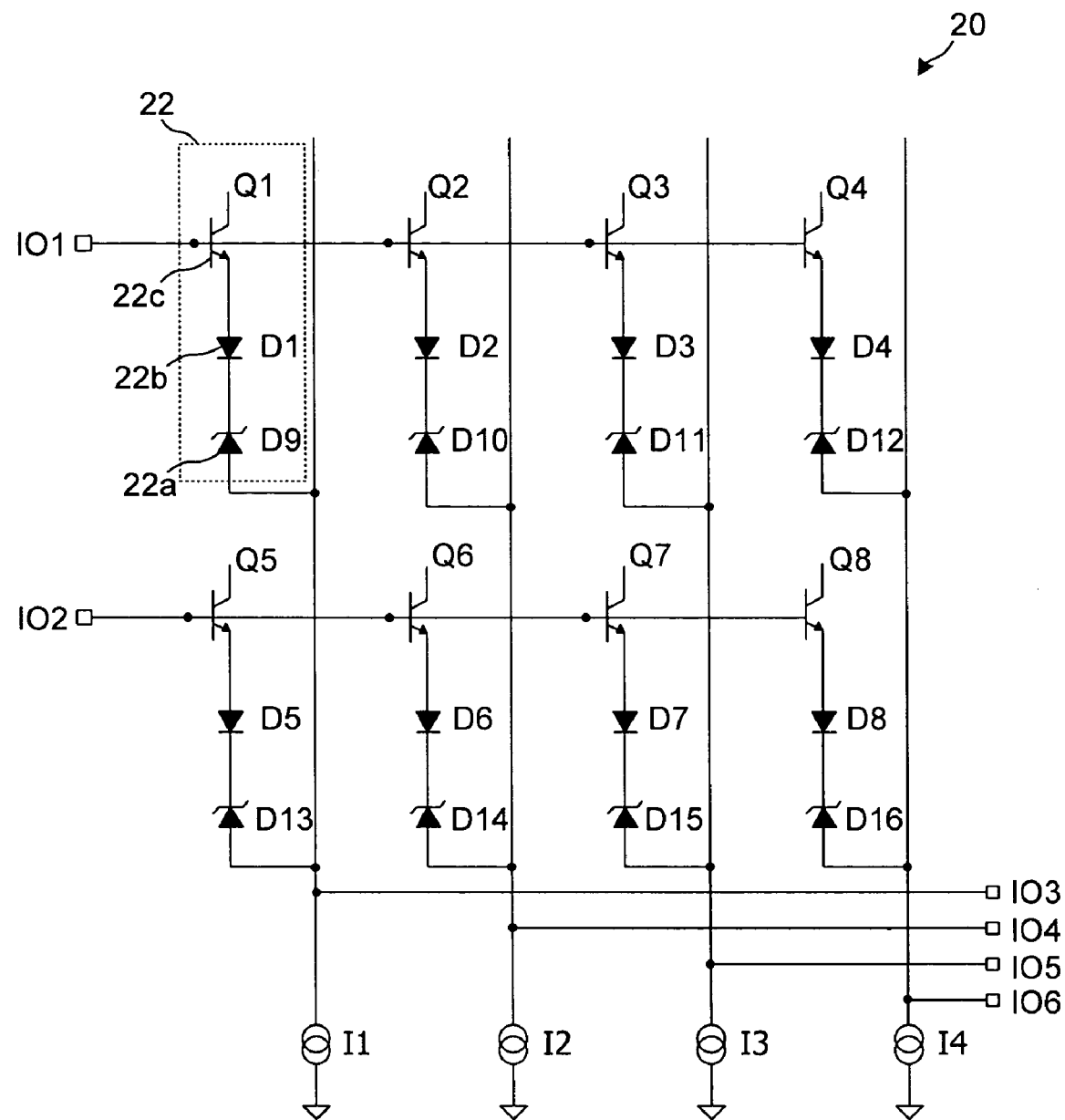
FIG. 4 is a schematic diagram of an array of programmable elements according to an alternate embodiment of the present invention.

FIG. 4 is a schematic diagram of an array of programmable elements according to an alternate embodiment of the present invention. Referring to FIG. 4, an array 20 includes two rows by four columns of programmable elements 22. Programmable element 22 is configured in a similar manner as programmable element 12 of FIG. 3 and includes a programmable polysilicon structure 22a, such as a zener zap device, and a polysilicon blocking diode 22b serially connected in a back-to-back fashion. The programmable structure 22a and the blocking diode 22b are fabricated in the same manner, and thus will exhibit similar breakdown voltage characteristics. However, in the present embodiment, programmable element 22 further includes an NPN bipolar transistor 22c connected in series with polysilicon blocking diode 22b. Specifically, bipolar transistor 22c has a base terminal coupled to the associated row line and an emitter terminal coupled to the p-terminal of polysilicon blocking diode 22b. The collector terminals of all of the bipolar transistors 22c of array 20 are connected in common to a positive voltage.

In operation, bipolar transistor 22c realizes current multiplication at each programmable element and therefore serves to reduce the row line drive requirement. By driving each programmable element with a bipolar transistor, the resistive drop along the row line is reduced and the performance of the array is enhanced. Thus, adding a bipolar transistor to each programmable element in an array enables the fabrication of a high speed programmable array.

In conventional programmable arrays, it is often not feasible to add a bipolar transistor for driving the programmable element. This is because the emitter-base reverse bias breakdown voltage of high performance bipolar transistors is often lower than the programming voltage Vp. Thus, without a blocking diode, the bipolar transistor will end up breaking down when the programming voltage is applied. When a blocking diode built in the silicon substrate is used, such a diode introduces a large amount of parasitic capacitance that limits the operation speed of the programmable array.

In accordance with the present invention, a polysilicon blocking diode 22b having compatible breakdown voltage characteristics as the programmable polysilicon structure 22a is included in the programmable element of the present invention. The polysilicon blocking diode functions to extend the breakdown voltage tolerance of the programmable element without adding substantial undesirable parasitic capacitance. In addition, the polysilicon blocking diode functions to isolate the base to emitter capacitance of transistor 22c from the columns lines, ensuring that no additional parasitic capacitance is added to the array due to the bipolar transistor. Thus, the bipolar transistor can provide current multiplication for enhancing the performance of the array without suffering from emitter-base breakdown due to high programming voltages.

In programmable element 22, the reverse bias breakdown voltage that can be sustained at each programmable element is the sum of the reverse bias breakdown voltage of the polysilicon blocking diode and the reverse bias breakdown voltage of the emitter-base junction of the bipolar transistor. Because the emitter-base breakdown voltage of the bipolar transistor adds to the blocking diode reverse breakdown voltage, a blocking diode breakdown voltage that is essentially equal to the programmable element breakdown voltage can be tolerated in programmable element 22, thereby eliminating the need for process or device geometry adjustments to enhance the breakdown voltage of the polysilicon blocking diode. In other words, with the inclusion of the bipolar transistor, the blocking diode and the zener zap device can be made to have identical or similar breakdown voltage characteristics. The application of a programming voltage that is sufficient to breakdown the zener zap device will not cause the blocking diode to breakdown because of the addition of the emitter-base breakdown voltage of the bipolar transistor.

The polysilicon blocking diode and the zener zap device of programming element 22 can be implemented using the structures shown in FIGS. 6A to 6C. The bipolar transistor can be forming using conventional techniques and coupled to the p-terminal of the blocking diode through metallization line and contacts.

Figure 7:
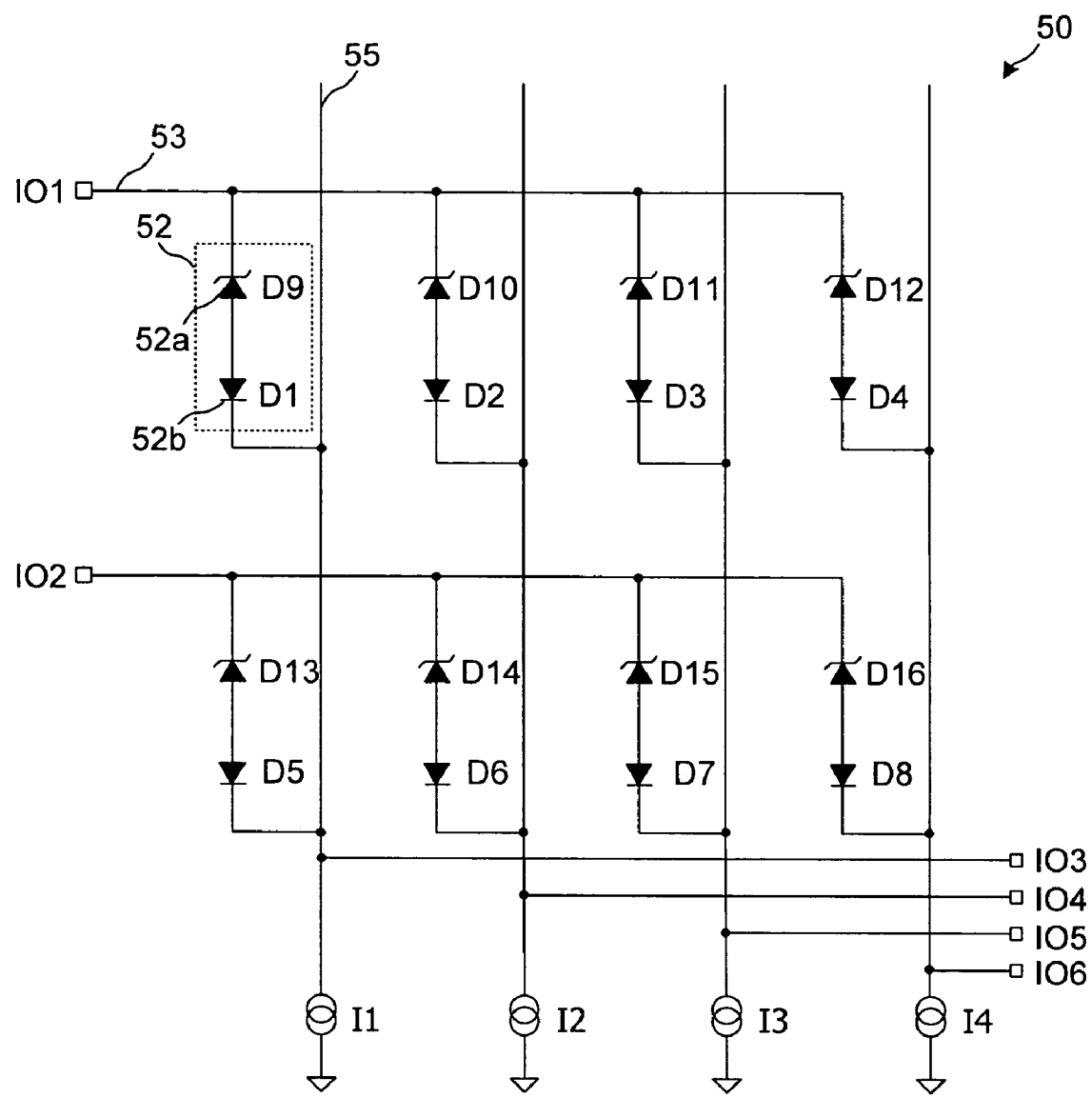
FIG. 7 is a schematic diagram of an array of programmable elements according to another embodiment of the present invention.

FIG. 7 is a schematic diagram of an array of programmable elements according to another embodiment of the present invention. In FIG. 7, an array 50 of programmable elements 52 is formed in a similar manner as array 10 of FIG. 3. However, in the present embodiment, the positioning of programmable polysilicon structure 52a and polysilicon blocking diode 52b is reversed. That is, programmable polysilicon structure 52a and polysilicon blocking diode 52b are connected back-to-back through their p-terminals. The n-terminal of programmable polysilicon structure 52a is connected to row line 53 while the n-terminal of polysilicon blocking diode 52b is connected to column line 55. Array 50 operates in the same manner as array 10 described above.

Figure 8:
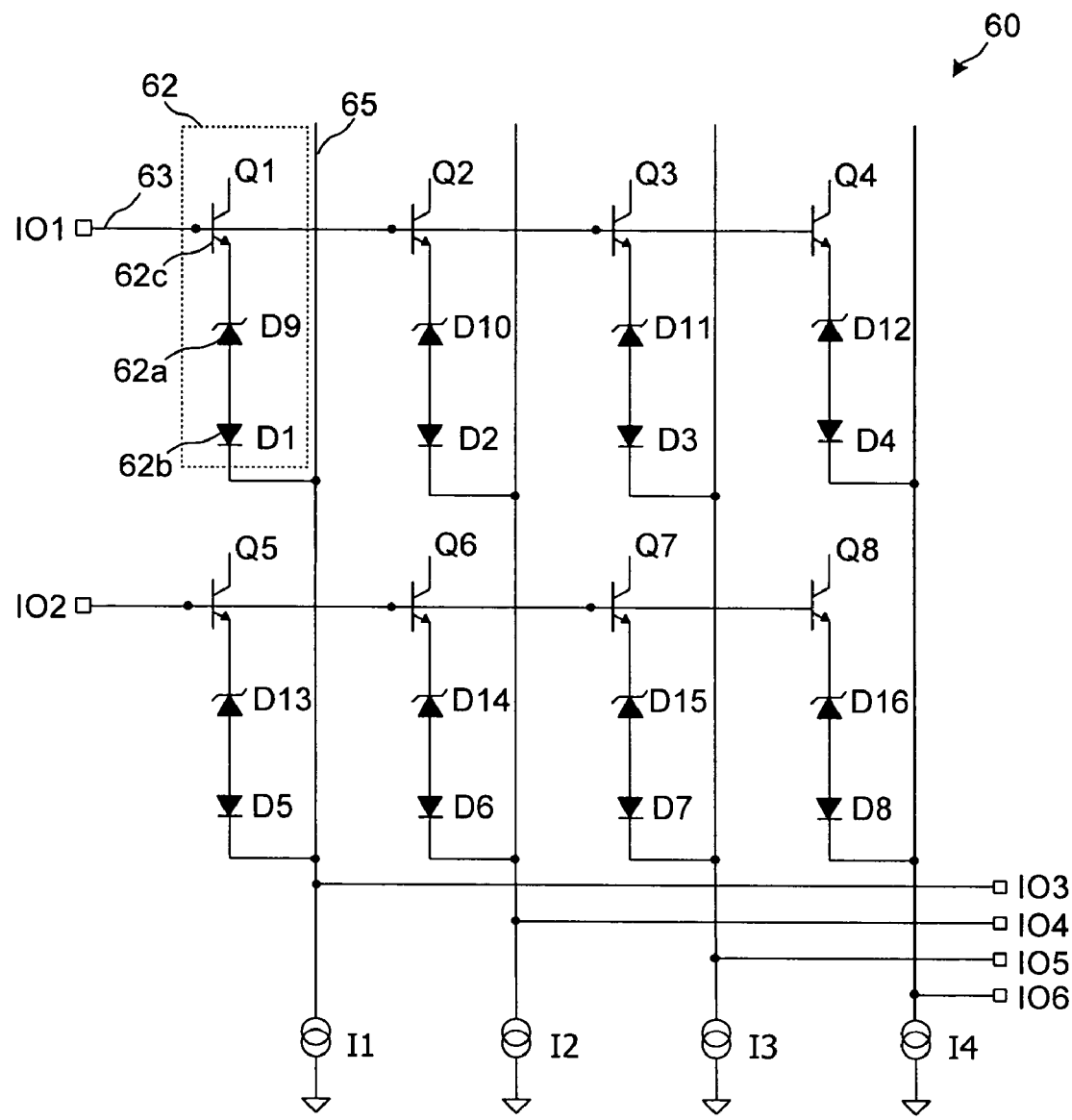
FIG. 8 is a schematic diagram of an array of programmable elements according to another embodiment of the present invention.

FIG. 8 is a schematic diagram of an array of programmable elements according to another embodiment of the present invention. In FIG. 8, an array 60 of programmable elements 62 is formed in a similar manner as array 20 of FIG. 4. However, in the present embodiment, the positioning of programmable polysilicon structure 62a and polysilicon blocking diode 62b is reversed. That is, programmable polysilicon structure 62a and polysilicon blocking diode 62b are connected back-to-back through their p-terminals. The n-terminal of programmable polysilicon structure 62a is connected to the emitter terminal of transistor 62c while the n-terminal of polysilicon blocking diode 62b is connected to column line 65. Array 60 operates in the same manner as array 20 described above. The configuration of programmable element 62 in array 60 enables further integration as will be described in more detail below.

Figure 9A:
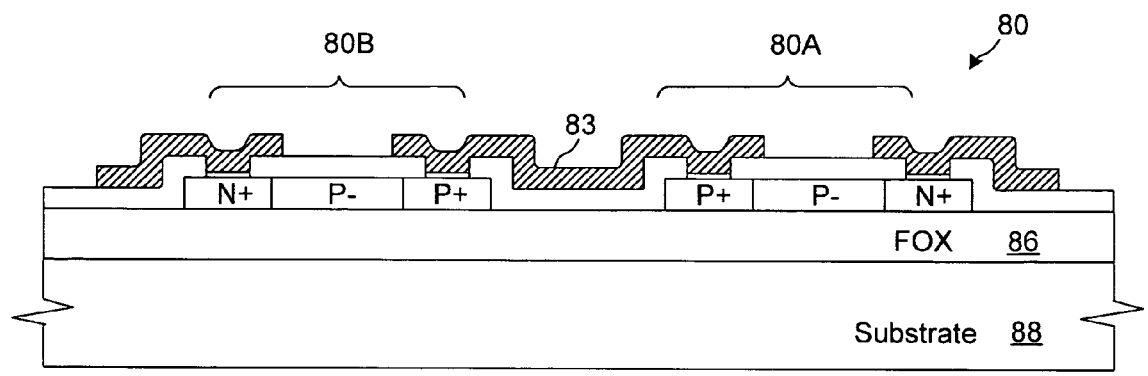
FIGS. 9A to 9C illustrate implementations of the programmable element of FIGS. 7 and 8 according to three different embodiments of the present invention.
Figure 9B:
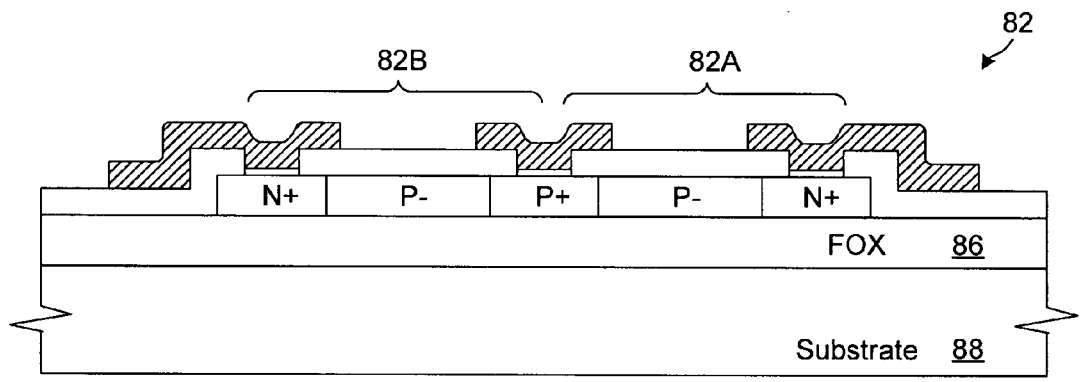
Figure 9C:
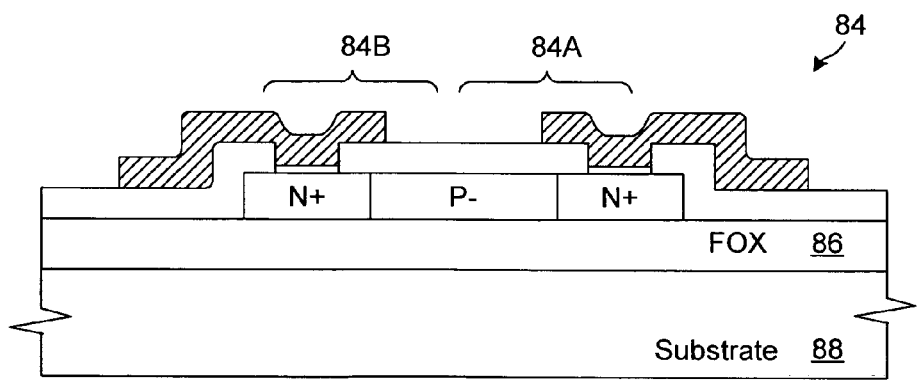

FIGS. 9A to 9C illustrate implementations of programmable element 52 or 62 according to three different embodiments of the present invention. In all the structures, the programmable element is both formed on top of a field oxide layer 86 overlying a silicon substrate 88, thereby isolating the programmable element from the silicon substrate and maintaining a low parasitic capacitance for each programmable element. In other embodiments, a dielectric layer other than a field oxide layer can be used to insulate the programmable element from the silicon substrate.

In FIG. 9A, polysilicon blocking diode 80B and programmable polysilicon structure (zener zap device) 80A are formed in separate polysilicon regions whereby the P+ regions of each diode are connected through a metallization line 83. In FIG. 9B, the polysilicon blocking diode 82B and the programmable polysilicon structure (zener zap device) 82A are formed in a contiguous polysilicon layer by merging the P+ regions of the two diodes. In FIG. 9C, the polysilicon blocking diode 84B and the programmable polysilicon structure (zener zap device) 84A are formed by eliminating the center P+ region and merging the P− region of the blocking diode 84B and the zener zap device 84A.

When the programmable element of the present invention is configured as shown in FIG. 8, further integration of the programmable element is possible. Specifically, the n-type emitter terminal of the bipolar transistor can be formed by extending the emitter polysilicon and merging the n-type emitter polysilicon with the n-type terminal of the zener zap device. In this manner, the density of array 60 can be further increased.

As described above, when the programmable element of the present invention includes a bipolar transistor (FIGS. 4 and 8), the blocking diode and the polysilicon zener zap device can be constructed in an identical manner and can have identical or similar breakdown voltage characteristics. When the blocking diode and the polysilicon zener zap device have identical or similar breakdown voltages, the two devices constitute two back-to-back connected p-n junction devices and their functions are interchangeable. That is, either one of the two back-to-back connected p-n junction devices can serve as the blocking diode or the zener zap device. When a programming voltage is applied to the bipolar transistor, the p-n junction device that is reversed biased will be zapped and the other p-n junction device will be forward biased. Essentially, the programmable element of the present invention including a bipolar transistor can be characterized as including two back-to-back connected p-n junctions wherein one p-n junction serves the function of the blocking diode and the other serves as the zener zap device.

While the programmable element of the present invention provides numerous advantages as discussed above, the programmable element of the present invention provides particular advantage when used to form large programmable logic arrays capable of being operated at very high speed. In operation, each axis of the array is driven either by a voltage source or a current source. When the array is being read, the current source driving a column line of the array has to discharge the capacitance associated with all the programmable elements coupled to the column. When formed in a large array, column line capacitance can become very large due to cumulative parasitic capacitance, thereby prohibiting very fast switching operation to take place. Parasitic capacitance on a column line is a particular problem in conventional programmable arrays because the blocking diodes are formed in the silicon substrate which introduces a large amount of parasitic capacitance. For example, in an array where the blocking diodes are built using conventional bipolar or SiGe process in the silicon substrate, even a few hundred programmable elements may introduce unacceptable, performance limiting capacitance.

In accordance with the present invention, because the programmable elements are built in a polysilicon layer isolated from the substrate by a dielectric layer, the programmable elements introduce very little parasitic capacitance. Thus, a large array of programmable elements can be built to operate at very fast speed. The programmable elements of the present invention can be used to build very high performance programmable logic array for use in ECL or CML type applications.

The above detailed descriptions are provided to illustrate specific embodiments of the present invention and are not intended to be limiting. Numerous modifications and variations within the scope of the present invention are possible. For example, in the implementations shown in FIGS. 6A to 6C and in FIGS. 9A to 9C, the blocking diode and the zener zap device are formed in a lightly doped p-type polysilicon layer with the heavily doped N and P types regions being spaced apart. In other embodiments, the base polysilicon layer can be a lightly doped n-type layer or the heavily doped N and P types regions can be formed contiguous. Alternately, PNP bipolar transistors or MOS transistors can be used in place of the NPN bipolar transistors in the implementation of FIGS. 4 and 8 with the corresponding change in the bias voltage polarities. Also, the programmable element can be formed in a polysilicon layer isolated from the substrate using any dielectric layer of suitable thickness. The use of a field oxide layer in the present description is illustrative only. The present invention is defined by the appended claims.

We claim:

1. A programmable element comprising:

a first p-n junction formed in a first portion of a polysilicon layer, the polysilicon layer being formed on the top surface of a dielectric layer, the dielectric layer being formed on the top surface of a semiconductor substrate and electrically isolating the polysilicon layer from the underlying semiconductor substrate, the first p-n junction including a first region of a first conductivity type and a second region of a second conductivity type;

a second p-n junction formed in a second portion of the polysilicon layer, the second p-n junction including a third region of the first conductivity type and a fourth region of the second conductivity type, the first region of the first p-n junction and the third region of the second p-n junction being electrically connected, the breakdown voltage of the first p-n junction being about the same as the breakdown voltage of the second p-n junction; and a transistor having a control terminal coupled to receive a programming voltage exceeding the breakdown voltage of the first or second p-n junction, a first current handling terminal coupled to the second region, and a second current handling terminal coupled to a first voltage source, wherein one of the first and second p-n junctions is programmed to a low impedance state when a programming voltage exceeding the breakdown voltage of the first or second p-n junction is applied to the control terminal of the transistor.

2. The programmable element of claim 1, wherein the first conductivity type comprises N-type conductivity and the second conductivity type comprises P-type conductivity, and the application of the programming voltage exceeding the breakdown voltage of the first or second p-n junction to the control terminal of the transistor causes the second p-n junction to be programmed to a low impedance state.

3. The programmable element of claim 1, wherein the first conductivity type comprises P-type conductivity and the second conductivity type comprises N-type conductivity, and the application of the programming voltage exceeding the breakdown voltage of the first or second p-n junction to the control terminal of the transistor causes the first p-n junction to be programmed to a low impedance state.

4. The programmable element of claim 1, wherein the transistor comprises a bipolar transistor.

5. The programmable element of claim 1, wherein the polysilicon layer comprises a lightly doped polysilicon layer of the first or second conductivity type, the first region comprises a heavily doped region of the first conductivity type and the second region comprises a heavily doped region of the second conductivity type, the first region being formed spaced apart from the second region, and wherein the third region comprises a heavily doped region of the first conductivity type and the fourth region comprises a heavily doped region of the second conductivity type, the third region being formed spaced apart from the fourth region.

6. The programmable element of claim 5, wherein the first portion of the polysilicon layer is formed separate from the second portion of the polysilicon layer.

7. The programmable element of claim 1, wherein the first portion and the second portion of the polysilicon layer comprise a contiguous portion of the polysilicon layer and the first region and the third region are formed as a single region of the first conductivity type in the polysilicon layer.

8. The programmable element of claim 7, wherein the polysilicon layer comprises a lightly doped polysilicon layer of the first or second conductivity type, the first region and third region comprise a single heavily doped region of the first conductivity type, the second region comprises a heavily doped region of the second conductivity type being formed spaced apart from the first region, and the fourth region comprises a heavily doped region of the second conductivity type being formed spaced apart from the third region.

9. The programmable element of claim 7, wherein the first region and third region comprise a single lightly doped region of the first conductivity type, the second region comprises a heavily doped region of the second conductivity type being formed adjacent the first region, and the fourth region comprises a heavily doped region of the second conductivity type being formed adjacent the third region.

10. The programmable element of claim 1, wherein the dielectric layer comprises a field oxide layer.

* * * * *